(12) United States Patent
Kitoh et al.

(10) Patent No.: US 10,873,128 B2
(45) Date of Patent: Dec. 22, 2020

(54) TFT SUBSTRATE, SCANNED ANTENNA HAVING TFT SUBSTRATE, AND METHOD FOR MANUFACTURING TFT SUBSTRATE

(71) Applicant: SHARP KABUSHIKI KAISHA, Sakai (JP)

(72) Inventors: Kenichi Kitoh, Sakai (JP); Fumitoshi Yasuo, Sakai (JP); Shinya Kadono, Sakai (JP); Junichi Inukai, Sakai (JP); Juxian Li, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 125 days.

(21) Appl. No.: 16/191,953

(22) Filed: Nov. 15, 2018

(65) Prior Publication Data

US 2019/0148824 A1 May 16, 2019

(30) Foreign Application Priority Data

Nov. 16, 2017 (JP) .................................. 2017-220676

(51) Int. Cl.
*H01Q 1/38* (2006.01)
*G02F 1/1343* (2006.01)
(Continued)

(52) U.S. Cl.
CPC ............. *H01Q 1/38* (2013.01); *G02F 1/1343* (2013.01); *H01L 27/124* (2013.01);
(Continued)

(58) Field of Classification Search
CPC ..... H01Q 1/38; H01Q 3/44; H01Q 1/364; H01Q 21/0087; H01Q 21/064;
(Continued)

(56) References Cited

U.S. PATENT DOCUMENTS 7,466,269 B2   12/2008  Haziza
7,847,894 B2 * 12/2010  Rho ................... G02F 1/133555
                                                       349/106
(Continued)

FOREIGN PATENT DOCUMENTS

CN    103489882 A    1/2014
CN    107210534 A    9/2017
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — Hai V Tran
(74) *Attorney, Agent, or Firm* — ScienBiziP, P.C.

(57) ABSTRACT

A TFT substrate includes a dielectric substrate and a plurality of antenna unit regions arranged on the dielectric substrate. Each of the plurality of antenna unit regions has a TFT and a patch electrode electrically connected to the drain electrode of the TFT. The patch electrode includes a first electrode layer formed of the same conductive film as the gate electrode of the TFT and a second electrode layer formed of the same conductive film as the source electrode of the TFT.

13 Claims, 6 Drawing Sheets

(51) Int. Cl.
  *H01L 27/12* (2006.01)
  *H01Q 21/00* (2006.01)
  *H01Q 3/44* (2006.01)
  *H01Q 1/36* (2006.01)
  *H01L 29/45* (2006.01)
  *H01Q 21/06* (2006.01)

(52) U.S. Cl.
  CPC ...... *H01L 27/1214* (2013.01); *H01L 27/1225* (2013.01); *H01L 29/45* (2013.01); *H01Q 1/364* (2013.01); *H01Q 3/44* (2013.01); *H01Q 21/0087* (2013.01); *H01Q 21/064* (2013.01)

(58) Field of Classification Search
  CPC ... H01L 27/124; H01L 27/1225; H01L 29/45; H01L 27/1214; G02F 1/1343
  USPC .......................................................... 343/789
  See application file for complete search history.

(56) References Cited

U.S. PATENT DOCUMENTS

| | | | |
|---|---|---|---|
| 2012/0092577 | A1 | 4/2012 | Shi et al. |
| 2012/0138922 | A1 | 6/2012 | Yamazaki et al. |
| 2012/0194399 | A1 | 8/2012 | Bily et al. |
| 2013/0320334 | A1 | 12/2013 | Yamazaki et al. |
| 2014/0286076 | A1 | 9/2014 | Aoki et al. |
| 2015/0206979 | A1* | 7/2015 | Shimada ............ H01L 29/41733 257/43 |
| 2016/0035746 | A1 | 2/2016 | Kong et al. |
| 2016/0261042 | A1* | 9/2016 | Sazegar .................. H01Q 3/24 |
| 2018/0337446 | A1* | 11/2018 | Nakazawa ........ H01Q 21/0087 |
| 2019/0265527 | A1* | 8/2019 | Misaki ..................... H01Q 3/34 |
| 2019/0273162 | A1* | 9/2019 | Misaki ................... H01Q 13/22 |
| 2019/0288381 | A1* | 9/2019 | Misaki .................. H01L 29/786 |
| 2019/0296057 | A1* | 9/2019 | Misaki ................... H01Q 15/14 |
| 2019/0341691 | A1* | 11/2019 | Misaki ..................... H01Q 3/34 |
| 2019/0385960 | A1* | 12/2019 | Misaki ................... G02F 1/1343 |
| 2020/0014120 | A1* | 1/2020 | Misaki .................. H01L 27/124 |
| 2020/0083604 | A1* | 3/2020 | Misaki ..................... H01Q 3/44 |
| 2020/0112106 | A1* | 4/2020 | Misaki ................... H01Q 13/22 |
| 2020/0127012 | A1* | 4/2020 | Misaki ..................... H01Q 3/44 |
| 2020/0161342 | A1* | 5/2020 | Misaki ................ H01L 29/7869 |

FOREIGN PATENT DOCUMENTS

| | | |
|---|---|---|
| JP | 2002-217640 A | 8/2002 |
| JP | 2007-116573 A | 5/2007 |
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 Digestpp. 824-826.

Kuki, "New Functional Element Using Liquid Crystal" Polymer, vol. 55, August issue, pp. 599-602 (2006) (A concise explanation of the relevance can be found in paragraph [0026] of the specification of the subject application).

Co-pending letter regarding a related co-pending U.S. Appl. No. 15/542,488, filed Jul. 10, 2017

* cited by examiner

TFT SUBSTRATE, SCANNED ANTENNA HAVING TFT SUBSTRATE, AND METHOD FOR MANUFACTURING TFT SUBSTRATE

BACKGROUND

1. Field

The present disclosure relates to a scanning antenna, in particular, to a scanning antenna (also referred to as a "liquid crystal array antenna") in which an antenna unit (also referred to as an "element antenna") has a liquid crystal capacity, a TFT substrate to be used in such a scanning antenna, and a method of manufacturing such a TFT substrate.

2. Description of the Related Art

Antennas for mobile communication and satellite broadcasting are required to have a function of being able to change beam direction (referred to as "beam scanning" or "beam steering"). A phased array antenna provided with an antenna unit is known as an antenna having such a function (referred to below as a "scanning antenna"). However, the phased array antenna of the related art is expensive, which is an obstacle to widespread use as a consumer product. In particular, as the number of antenna units increases, the cost rises remarkably.

Therefore, scanning antennas using the large dielectric anisotropy (birefringence) of a liquid crystal material (including a nematic liquid crystal and a polymer dispersed liquid crystal) have been proposed (Japanese Unexamined Patent Application Publication No. 2007-116573, Japanese Unexamined Patent Application Publication No. 2007-295044, Japanese Unexamined Patent Application Publication (Translation of PCT Application) No. 2009-538565, Japanese Unexamined Patent Application Publication (Translation of PCT Application) No. 2013-539949, and International Publication No. 2015/126550 and R. A. Stevenson et al., "Rethinking Wireless Communications: Advanced Antenna Design using LCD Technology", SID 2015 DIGEST, pp. 827-830). Since the dielectric constant of the liquid crystal material has frequency variance, in the present specification, the dielectric constant in the frequency band of microwaves (also referred to as "dielectric constant with respect to microwaves") is denoted as the "dielectric constant M ($\varepsilon M$)" in particular.

Japanese Unexamined Patent Application Publication (Translation of PCT Application) No. 2009-538565 and R. A. Stevenson et al., "Rethinking Wireless Communications: Advanced Antenna Design using LCD Technology", SID 2015 DIGEST, pp. 827-830 describe that it is possible to obtain an inexpensive scanning antenna by using liquid crystal display device (referred to below as "LCD") technology.

The present applicant has developed a scanning antenna which is able to be mass-produced using the LCD manufacturing techniques of the related art. International Publication No. 2017/061527 by the present applicant discloses a scanning antenna which is able to be mass-produced using the LCD manufacturing techniques of the related art, a TFT substrate to be used for such a scanning antenna, and a manufacturing method and a driving method for such a scanning antenna. All of the disclosure of International Publication No. 2017/061527 is incorporated in the present specification by reference.

SUMMARY

The present inventors examined various structures in order to reduce the cost of the scanning antenna described in International Publication No. 2017/061527. In the present disclosure, it is desirable to reduce the cost of the scanning antenna while suppressing deterioration of the antenna performance. In the present disclosure, it is also desirable to provide a TFT substrate which is able to reduce the cost of the scanning antenna while suppressing deterioration of the antenna performance and a method of manufacturing such a TFT substrate.

A TFT substrate according to an embodiment of the present disclosure includes a dielectric substrate, a plurality of antenna unit regions arranged on the dielectric substrate and each having a TFT and a patch electrode electrically connected to a drain electrode of the TFT, in which the patch electrode includes a first electrode layer formed of a conductive film identical to a conductive film of a gate electrode of the TFT and a second electrode layer formed of a conductive film identical to a conductive film of a source electrode of the TFT.

A scanning antenna according to an embodiment of the present disclosure includes the above TFT substrate, a slot substrate arranged to face the TFT substrate, a liquid crystal layer provided between the TFT substrate and the slot substrate, and a reflective conductive plate arranged to face a surface of the slot substrate on an opposite side to the liquid crystal layer via a dielectric layer, in which the slot substrate has another dielectric substrate, and a slot electrode formed on a surface of the other dielectric substrate on a side of the liquid crystal layer, the slot electrode has a plurality of slots, and each of the plurality of slots is arranged to correspond to the patch electrode in each of the plurality of antenna unit regions of the TFT substrate.

A method of manufacturing a TFT substrate according to an embodiment of the present disclosure is a manufacturing method of the above TFT substrates. The method includes (A) forming a gate conductive film on the dielectric substrate, (B) forming the gate electrode and the first electrode layer by patterning the gate conductive film, (C) depositing a gate insulating film which covers the gate electrode and the first electrode layer, (D) forming a first opening portion reaching the first electrode layer in the gate insulating film, (E) forming a source conductive film on the gate insulating film and in the first opening portion, and (F) forming the source electrode and the second electrode layer by patterning the source conductive film.

DESCRIPTION OF THE EMBODIMENTS

Figure 1:
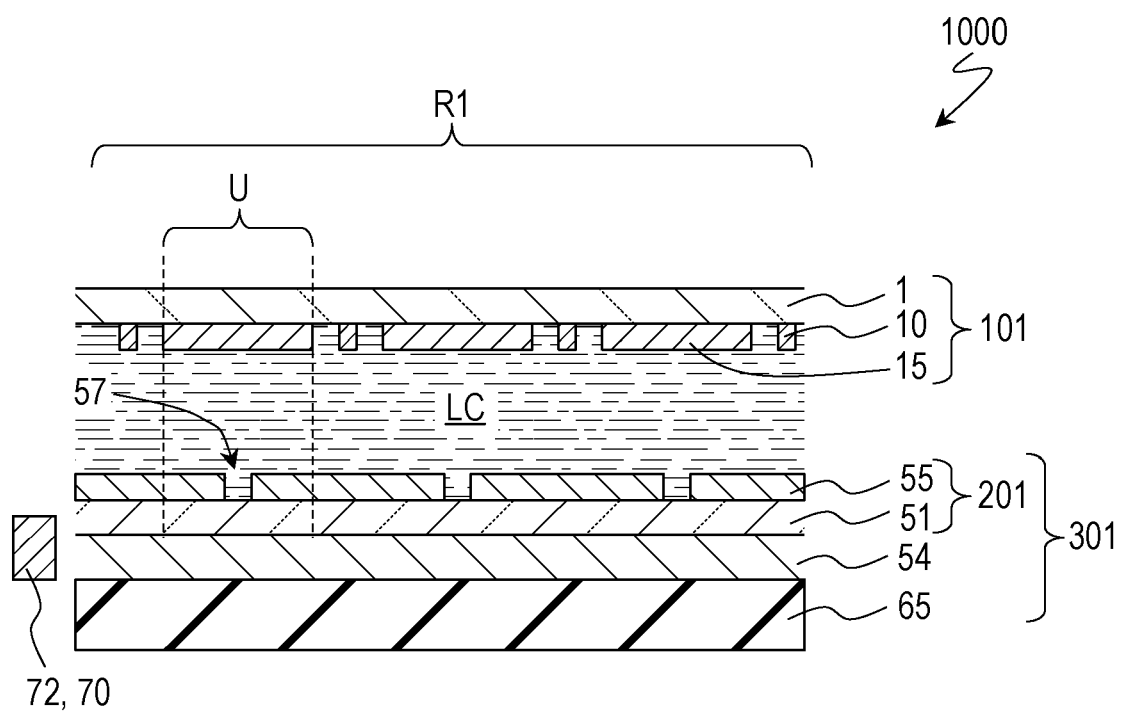
FIG. 1 is a sectional view schematically illustrating a portion of a scanning antenna according to an embodiment of the present disclosure.

A description will be given below of a scanning antenna, a method of manufacturing a scanning antenna, and a TFT substrate to be used for a scanning antenna according to embodiments of the present disclosure with reference to the drawings. Here, the present disclosure is not limited to the embodiments exemplified below. In addition, the embodiments of the present disclosure are not limited to the drawings. For example, the thicknesses of layers in a sectional view, the sizes of conductive portions and opening portions in a plan view, and the like are examples.

Basic Structure of Scanning Antenna

In a scanning antenna using antenna units using the anisotropy (birefringence) of a liquid crystal material with a large dielectric constant M ($\varepsilon M$), the voltage to be applied to each liquid crystal layer of antenna units associated with pixels of an LCD panel is controlled and the effective dielectric constant M ($\varepsilon M$) of the liquid crystal layer in each antenna unit is changed to form a two-dimensional pattern in antenna units with different electrostatic capacities (corresponding to the display of an image on the LCD). Retardation is imparted to electromagnetic waves (for example, microwaves) to be emitted from an antenna or to be received by an antenna according to the electrostatic capacity of each antenna unit to give a strong directivity in a specific direction (beam scanning) corresponding to the two-dimensional pattern formed by the antenna units having different electrostatic capacitances. For example, the electromagnetic waves to be emitted from the antenna are obtained by integrating spherical waves obtained as a result of input electromagnetic waves being incident to each antenna unit and scattered in each antenna unit, while taking the retardation to be imparted by each antenna unit into consideration. It is also possible to consider each antenna unit as functioning as a "phase shifter". Refer to Japanese Unexamined Patent Application Publication No. 2007-116573, Japanese Unexamined Patent Application Publication No. 2007-295044, Japanese Unexamined Patent Application Publication (Translation of PCT Application) No. 2009-538565, and Japanese Unexamined Patent Application Publication (Translation of PCT Application) No. 2013-539949 and R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985) for the basic structure and operating principles of a scanning antenna using a liquid crystal material. M. ANDO et al., "A Radial Line Slot Antenna for 12 GHz Satellite TV Reception", IEEE Transactions of Antennas and Propagation, Vol. AP-33, No. 12, pp. 1347-1353 (1985) discloses the basic structure of a scanning antenna in which spiral slots are arranged. All the disclosures of Japanese Unexamined Patent Application Publication No. 2007-116573, Japanese Unexamined Patent Application Publication No. 2007-295044, Japanese Unexamined Patent Application Publication (Translation of PCT Application) No. 2009-538565, and Japanese Unexamined Patent Application Publication (Translation of PCT Application) No. 2013-539949 and R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985) are incorporated in the present specification by reference.

Although the antenna units in the scanning antenna according to the embodiment of the present disclosure are similar to the pixels of an LCD panel, the structure of the antenna units differs from the structure of the pixels of the LCD panel and the arrangement of the plurality of antenna units also differs from the arrangement of the pixels in the LCD panel. A description will be given of the basic structure of the scanning antenna according to an embodiment of the present disclosure with reference to FIG. 1 illustrating the scanning antenna 1000 of the first embodiment which will be described in detail below. The scanning antenna 1000 is a radial inline slot antenna in which the slots are arranged in concentric circles; however, the scanning antenna according to the embodiment of the present disclosure is not limited thereto and, for example, the arrangement of the slots may be various known arrangements. In particular, for the slot and/or antenna unit arrangements, the entire disclosure of International Publication No. 2015/126550 is incorporated into the present specification for reference.

FIG. 1 is a sectional view schematically illustrating a portion of the scanning antenna 1000 of the present embodiment, and schematically illustrating a portion of a section along the radial direction from a power supply pin 72 (refer to FIG. 2B) provided in the vicinity of the center of the slots arranged in concentric circles.

The scanning antenna 1000 is provided with the TFT substrate 101, the slot substrate 201, a liquid crystal layer LC arranged therebetween, and a reflective conductive plate 65 arranged to face the slot substrate 201 via an air layer 54. The scanning antenna 1000 transmits and receives microwaves from the TFT substrate 101 side.

The TFT substrate 101 includes a dielectric substrate 1, which is a glass substrate or the like, a plurality of patch electrodes 15 formed on the dielectric substrate 1, and a plurality of TFTs 10. Each of the patch electrodes 15 is connected to the corresponding TFT 10. Each of the TFTs 10 is connected to a gate bus line and a source bus line.

The slot substrate 201 has a dielectric substrate 51, which is a glass substrate or the like, and a slot electrode 55 formed on the liquid crystal layer LC side of the dielectric substrate 51. The slot electrode 55 has a plurality of slots 57.

The reflective conductive plate 65 is arranged to face the slot substrate 201 via the air layer 54. Instead of the air layer 54, it is possible to use a layer formed of a dielectric body having a small dielectric constant M with respect to microwaves (for example, a fluorine resin such as PTFE). The slot electrode 55 and the reflective conductive plate 65 function as a waveguide 301 along with the dielectric substrate 51 and the air layer 54 therebetween.

The patch electrode 15, a portion of the slot electrode 55 including the slots 57, and the liquid crystal layer LC therebetween form the antenna unit U. In each antenna unit U, one patch electrode 15 faces a portion of the slot electrode 55 including one slot 57 via the liquid crystal layer LC and forms a liquid crystal capacity. In addition, each of the antenna units U has an auxiliary capacitance (refer to, for example, FIGS. 3A and 3B) electrically connected in parallel with the liquid crystal capacity. The antenna units U of the scanning antenna 1000 and pixels in an LCD panel have a similar configuration. However, the scanning antenna 1000 has many points of difference from the LCD panel.

First, the performance required for the dielectric substrates 1 and 51 of the scanning antenna 1000 is different from the performance required for the substrate of the LCD panel.

Generally, LCD panels use a transparent substrate transparent to visible light is used for the LCD panel and, for example, it is possible to use a glass substrate or a plastic substrate. A semiconductor substrate may be used in a reflective LCD panel since the substrate on the rear side does not need transparency. On the other hand, the dielectric substrates 1 and 51 for antennas preferably have a small dielectric loss with respect to microwaves (the dielectric loss tangent with respect to microwaves is expressed as tan δM). The tan δM of the dielectric substrates 1 and 51 is preferably approximately 0.03 or less, and more preferably 0.01 or less. Specifically, it is possible to use a glass substrate or a plastic substrate. The glass substrate is superior to the plastic substrate in dimensional stability and heat resistance and is suitable for forming circuit elements such as TFTs, wiring, and electrodes using LCD technology. For example, in a case where the material forming the waveguide is air and glass, since the dielectric loss of the glass is larger, from the viewpoint that it is possible to reduce the waveguide loss when the glass is thinner, the glass is preferably 400 μm or less, and more preferably 300 μm or less. There is no particular lower limit as long as handling is possible without breaking in the manufacturing process.

The conductive material used for the electrodes is also different. In many cases, an ITO film is used as a transparent conductive film for a pixel electrode and a counter electrode of an LCD panel. However, ITO has a large tan δM with respect to microwaves and use thereof as a conductive layer in an antenna is not possible. The slot electrode 55 functions as a wall of the waveguide 301 together with the reflective conductive plate 65. Accordingly, in order to suppress the transmission of microwaves in the wall of the waveguide 301, the thickness of the wall of the waveguide 301, that is, the thickness of the metal layer (Cu layer or Al layer), is preferably large. It is known that if the thickness of the metal layer is three times the skin depth, the electromagnetic waves are attenuated to 1/20 (−26 dB), and if the thickness of the metal layer is 5 times, the electromagnetic waves are attenuated to approximately 1/150 (−43 dB). Therefore, if the thickness of the metal layer is five times the skin depth, it is possible to reduce the electromagnetic wave transmittance to 1%. For example, for a microwave of 10 GHz, if a Cu layer having a thickness of 3.3 μm or more and an Al layer having a thickness of 4.0 μm or more are used, it is possible to reduce the microwaves to 1/150. In addition, for a microwave of 30 GHz, if a Cu layer having a thickness of 1.9 μm or more and an Al layer having a thickness of 2.3 μm or more are used, it is possible to reduce the microwave to 1/150. In this manner, the slot electrode 55 is preferably formed of a comparatively thick Cu layer or Al layer. There is no particular upper limit to the thickness of the Cu layer or the Al layer, and it is possible to appropriately set the upper limit in consideration of the film forming time and cost. Using a Cu layer makes it possible to obtain the advantage of being thinner than when using an Al layer. As for the forming of the relatively thick Cu layer or Al layer, it is also possible to adopt not only the thin film deposition method used in the LCD manufacturing process but also other methods such as bonding Cu foil or Al foil to the substrate. The thickness of the metal layer is, for example, 2 μm or more and 30 μm or less. In a case where the thin film deposition method is used for the forming, the thickness of the metal layer is preferably 5 μm or less. As the reflective conductive plate 65, for example, it is possible to use an aluminum plate, a copper plate, or the like having a thickness of several mm.

Since the patch electrode 15 does not form the waveguide 301 in the manner of the slot electrode 55, it is possible to use a Cu layer or an Al layer having a smaller thickness than the slot electrode 55. However, the resistance is preferably low in order to avoid loss turning into heat when the vibration of free electrons in the vicinity of the slots 57 of the slot electrode 55 induces the vibration of free electrons in the patch electrode 15. From the viewpoint of mass production, it is preferable to use an Al layer rather than a Cu layer, and the thickness of the Al layer is preferably 0.3 μm or more and 2 μm or less, for example.

In addition, the arrangement pitch of the antenna units U is greatly different from the pixel pitch. For example, when considering an antenna for microwaves of 12 GHz (Ku band), the wavelength λ is, for example, 25 mm. Then, as described in Japanese Unexamined Patent Application Publication (Translation of PCT Application) No. 2013-539949, since the pitch of the antenna units U is λ/4 or less and/or λ/5 or less, the pitch of the antenna units U is 6.25 mm or less and/or 5 mm or less. This is ten times greater or more in comparison with the pixel pitch of the LCD panel. Accordingly, the lengths and widths of the antenna units U are also approximately ten times greater than the lengths and widths of the pixels of the LCD panel.

Naturally, it is possible for the arrangement of the antenna units U to be different from the arrangement of the pixels in the LCD panel. Here, an example in which the antenna units U are arranged in concentric circles (for example, refer to Japanese Unexamined Patent Application Publication No. 2002-217640) is illustrated, but, without being limited thereto, the antenna units U may be arranged in a spiral, for example, as described in M. ANDO et al., "A Radial Line Slot Antenna for 12 GHz Satellite TV Reception", IEEE Transactions of Antennas and Propagation, Vol. AP-33, No. 12, pp. 1347-1353 (1985). Furthermore, the antenna units U may be arranged in a matrix as described in Japanese Unexamined Patent Application Publication (Translation of PCT Application) No. 2013-539949.

The characteristics required for the liquid crystal material of the liquid crystal layer LC of the scanning antenna 1000 are different from the characteristics required for the liquid crystal material of the LCD panel. The display of an LCD panel is created by changing the refractive index of the liquid crystal layer of the pixels to impart retardation to the polarized light of visible light (wavelength 380 nm to 830 nm) to change the polarization state (for example, rotating the polarization axis direction of linearly polarized light or changing the degree of circular polarization of circularly polarized light). In contrast, the scanning antenna 1000 according to the embodiment changes the phase of the microwaves to be excited (re-radiated) from each patch electrode by changing the electrostatic capacitance value of the liquid crystal capacity of the antenna unit U. Accordingly, in the liquid crystal layer, the anisotropy (δεM) of the dielectric constant M (εM) with respect to microwaves is preferably large and tan δM is preferably small. For example, it is possible to suitably use the liquid crystal material described in M. Wittek et al., SID 2015 DIGEST pp. 824-826 in which δεM is 4 or more and tan δM is 0.02 or less (both values of 19 Gz). In addition, it is possible to use the liquid crystal material described in Kuki, Polymer 55 vol. August issue pp. 599-602 (2006) in which δεM is 0.4 or more and tan δM is 0.04 or less.

In general, the dielectric constant of a liquid crystal material has a frequency variance, but the dielectric anisotropy δεM with respect to microwaves has a positive correlation with the refractive index anisotropy δn with respect to visible light. Accordingly, the liquid crystal material for an antenna unit for microwaves is preferably a material having a large refractive index anisotropy δn with respect to visible light in other words. The refractive index anisotropy δn of the liquid crystal material for LCD is evaluated by the refractive index anisotropy with respect to light at 550 nm. Here too, when δn (birefringence) for light of 550 nm is used as an index, a nematic liquid crystal having δn of 0.3 or more, preferably 0.4 or more is used for an antenna unit for microwaves. δn has no particular upper limit. However, since the liquid crystal material having a large δn tends to have a strong polarity, there is a concern that the reliability may be deteriorated. The thickness of the liquid crystal layer is, for example, 1 μm to 500 μm.

A more detailed description will be given below of the structure of the scanning antenna according to the embodiment of the present disclosure.

Figure 2A:
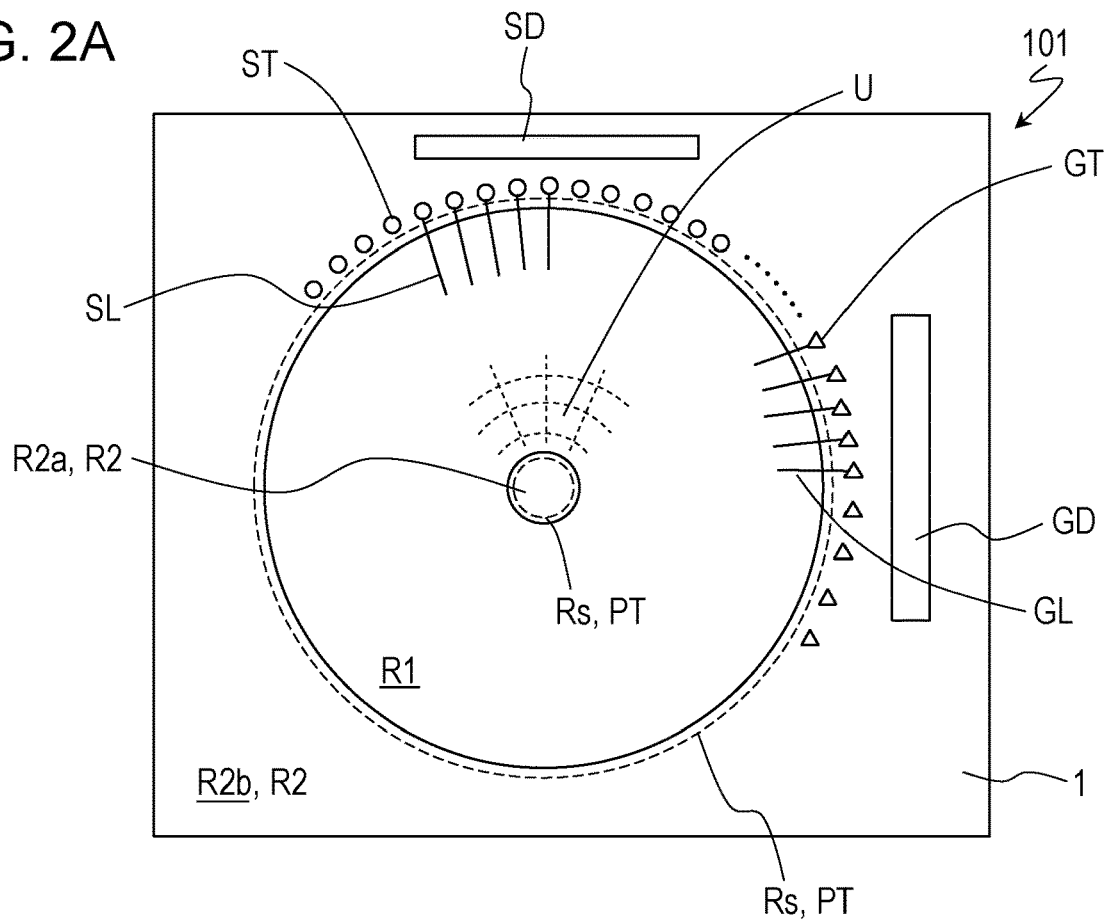
FIG. 2A and FIG. 2B are schematic plan views illustrating a TFT substrate and a slot substrate provided in the scanning antenna, respectively.
Figure 2B:
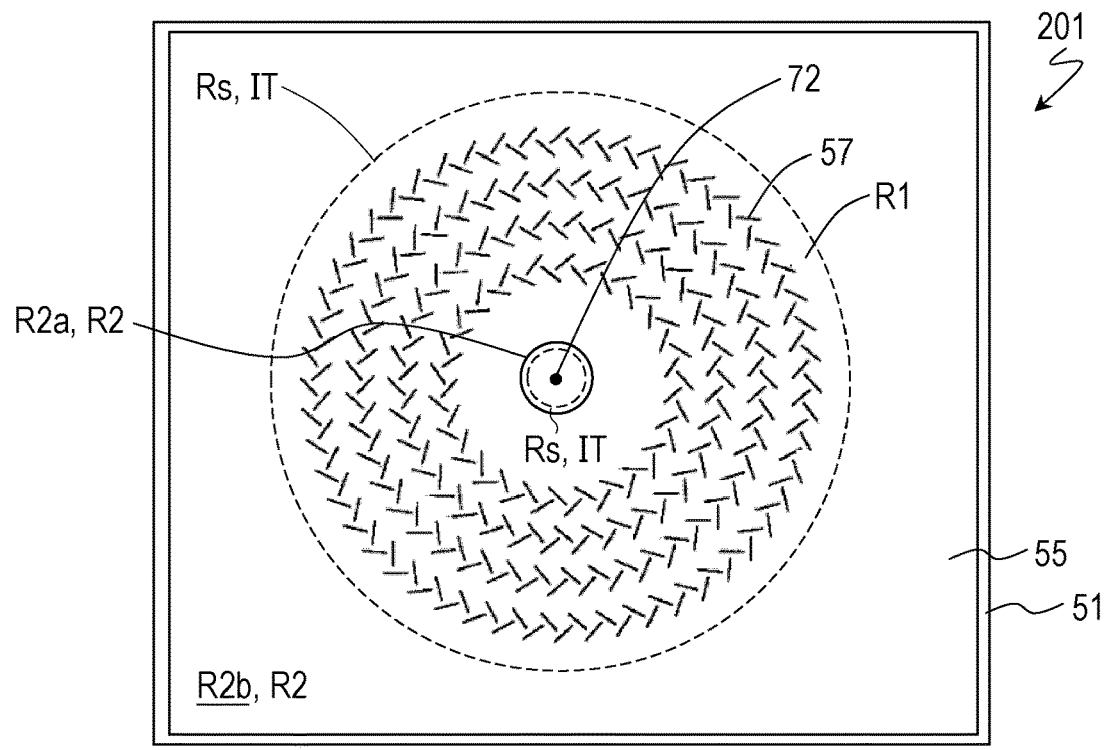

First, refer to FIG. 1 and FIGS. 2A and 2B. FIG. 1 is a schematic partial sectional view of the vicinity of the center of the scanning antenna 1000 as detailed above, and FIG. 2A and FIG. 2B are schematic plan views illustrating the TFT substrate 101 and the slot substrate 201 provided in the scanning antenna 1000, respectively.

The scanning antenna 1000 has a plurality of antenna units U arranged two-dimensionally and, in the scanning antenna 1000 given as an example here, a plurality of antenna units are arranged in concentric circles. In the following description, the region of the TFT substrate 101 and the region of the slot substrate 201 corresponding to the antenna unit U will be referred to as "antenna unit regions", and the same reference character U as the antenna unit will be attached thereto. In addition, as illustrated in FIG. 2A and FIG. 2B, in the TFT substrate 101 and the slot substrate 201, a region defined by a plurality of two-dimensionally arranged antenna unit regions is referred to as a "transmission/reception region R1", and the region other than the transmission/reception region R1 is referred to as "non-transmission/reception region R2". In the non-transmission/reception region R2, a terminal portion, a drive circuit, and the like are provided.

FIG. 2A is a schematic plan view illustrating the TFT substrate 101 provided in the scanning antenna 1000.

In the illustrated example, the transmission/reception region R1 has a donut shape when viewed from the normal line direction of the TFT substrate 101. The non-transmission/reception region R2 includes a first non-transmission/reception region R2a positioned at the center of the transmission/reception region R1 and a second non-transmission/reception region R2b positioned at the periphery of the transmission/reception region R1. The outer diameter of the transmission/reception region R1 is, for example, 200 mm to 1500 mm, and is set according to the communication volume or the like.

A plurality of gate bus lines GL and a plurality of source bus lines SL supported on the dielectric substrate 1 are provided in the transmission/reception region R1 of the TFT substrate 101, and the antenna unit region U is defined by these wirings. The antenna unit regions U are, for example, arranged in concentric circles in the transmission/reception region R1. Each of the antenna unit regions U includes a TFT and a patch electrode electrically connected to the TFT. The source electrode and the gate electrode of the TFT are electrically connected to the source bus line SL and the gate bus line GL, respectively. In addition, the drain electrode is electrically connected to the patch electrode.

In the non-transmission/reception regions R2 (R2a, R2b), a seal region Rs is arranged to surround the transmission/reception region R1. A sealing material (not illustrated) is applied to the seal region Rs. The sealing material bonds the TFT substrate 101 and the slot substrate 201 to each other, and also encloses a liquid crystal between these substrates 101 and 201.

A gate terminal portion GT, a gate driver GD, a source terminal portion ST, and a source driver SD are provided outside the seal region Rs in the non-transmission/reception region R2. Each of the gate bus lines GL is connected to the gate driver GD via the gate terminal portion GT. Each of the source bus lines SL is connected to the source driver SD via the source terminal portion ST. In this example, the source driver SD and the gate driver GD are formed on the dielectric substrate 1, but one or both of these drivers may be provided on another dielectric substrate.

In addition, a plurality of transfer terminal portions PT are provided in the non-transmission/reception region R2. The transfer terminal portion PT is electrically connected to the slot electrode 55 (FIG. 2B) of the slot substrate 201. In the present specification, a connection portion between the transfer terminal portion PT and the slot electrode 55 is referred to as a "transfer portion". As illustrated in the drawing, the transfer terminal portion PT (transfer portion) may be arranged in the seal region Rs. In such a case, a resin containing conductive particles may be used as the sealing material. Due to this, liquid crystal is enclosed between the TFT substrate 101 and the slot substrate 201, and it is possible to secure the electrical connection between the transfer terminal portion PT and the slot electrode 55 of the slot substrate 201. In this example, the transfer terminal portion PT is arranged in both the first non-transmission/reception region R2a and the second non-transmission/reception region R2b, but may be arranged in only one thereof.

Here, the transfer terminal portion PT (transfer portion) may not be arranged in the seal region Rs. For example, transfer terminal portion PT may be arranged outside the seal region Rs in the non-transmission/reception region R2.

FIG. 2B is a schematic plan view illustrating the slot substrate 201 in the scanning antenna 1000 and illustrates the surface of the slot substrate 201 on the liquid crystal layer LC side.

In the slot substrate 201, the slot electrode 55 is formed on the dielectric substrate 51 across the transmission/reception region R1 and the non-transmission/reception region R2.

In the transmission/reception region R1 of the slot substrate 201, a plurality of the slots 57 are arranged in the slot electrode 55. The slots 57 are arranged corresponding to the antenna unit region U on the TFT substrate 101. In the illustrated example, in the plurality of the slots 57, pairs of the slots 57 are arranged in concentric circles extending in a direction substantially orthogonal to each other to form a radial in-line slot antenna. Since the slots are substantially orthogonal to each other, it is possible for the scanning antenna 1000 to transmit and receive circularly polarized waves.

A plurality of terminal portions IT of the slot electrodes 55 are provided in the non-transmission/reception region R2. The terminal portions IT are electrically connected to the transfer terminal portion PT (FIG. 2A) of the TFT substrate 101. In this example, the terminal portions IT are arranged in the seal region Rs and is electrically connected to the corresponding transfer terminal portion PT by a sealing material containing conductive particles.

In addition, in the first non-transmission/reception region R2a, the power supply pin 72 is arranged on the rear surface side of the slot substrate 201. Microwaves enter into the waveguide 301 formed by the slot electrode 55, the reflective conductive plate 65, and the dielectric substrate 51, through the power supply pin 72. The power supply pin 72 is connected to a power supply device 70. The power is supplied from the center of the concentric circle in which the slots 57 are arranged. The power supply method may be either a direct coupling power supply method or an electromagnetic coupling method, and it is possible to adopt a known power supply structure.

FIG. 2A and FIG. 2B illustrate an example in which the seal region Rs is provided to surround a comparatively narrow region including the transmission/reception region R1, but the present disclosure is not limited thereto. In particular, the seal region Rs provided outside the transmission/reception region R1 may be provided, for example, in the vicinity of the side of the dielectric substrate 1 and/or the dielectric substrate 51 to be at a certain distance or more from the transmission/reception region R1. Naturally, for example, the terminal portion and the drive circuit to be provided in the non-transmission/reception region R2 may be formed outside the seal region Rs (that is, the side where the liquid crystal layer is not present). Forming the seal region Rs at a position separated by a certain distance or more from the transmission/reception region R1 makes it possible to suppress deterioration of the antenna performance due to the influence of impurities (particularly ionic impurities) contained in the sealing material (particularly, curable resin).

Structure of TFT Substrate 101

Figure 3A:
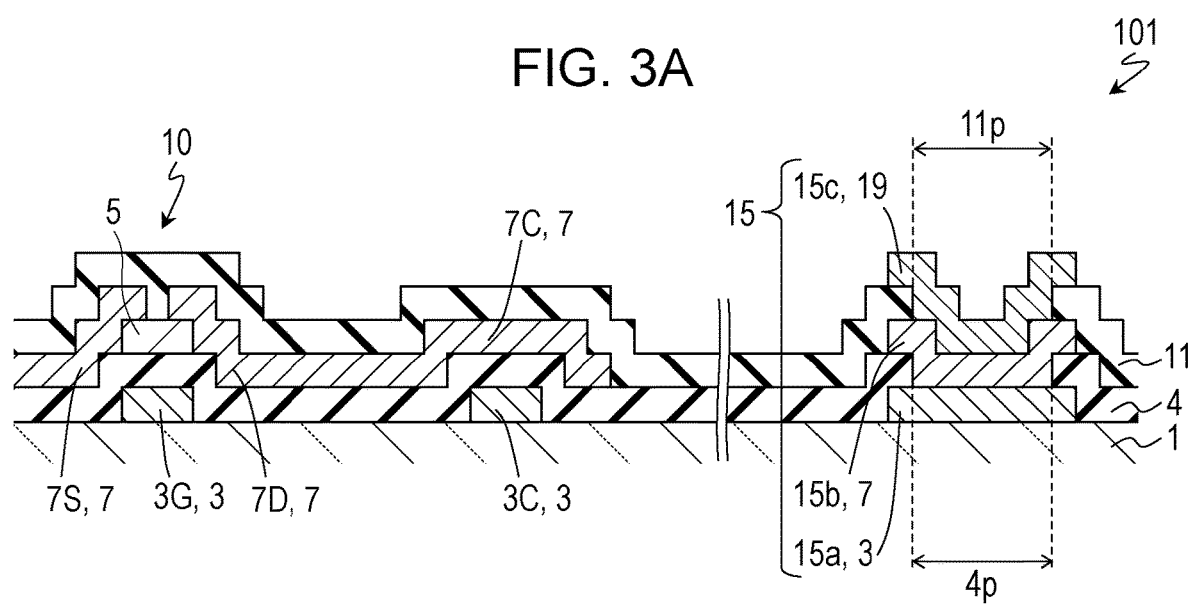
FIG. 3A is a schematic sectional view of the TFT substrate.
Figure 3B:
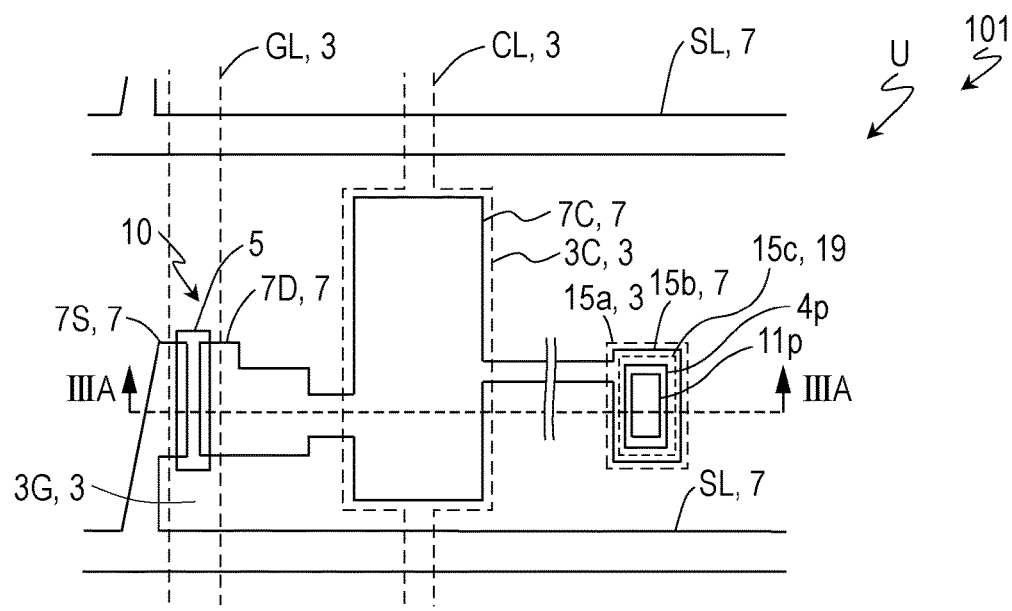
FIG. 3B is a schematic plan view of the TFT substrate.

With reference to FIGS. 3A and 3B, a detailed description will be given of the structure of the TFT substrate 101 provided in the scanning antenna 1000. FIG. 3A is a schematic sectional view of the TFT substrate 101 and illustrates a section along line IIIA-IIIA of FIG. 3B. FIG. 3B is a schematic plan view of the antenna unit region U of the TFT substrate 101.

As illustrated in FIGS. 3A and 3B, the TFT substrate 101 includes the dielectric substrate 1 and a plurality of antenna unit regions U arranged on the dielectric substrate 1. Each of the plurality of antenna unit regions U has the TFT 10 and the patch electrode 15 electrically connected to a drain electrode 7D of the TFT 10. The patch electrode 15 includes a first electrode layer 15a formed from the same conductive film as a gate electrode 3G of the TFT 10 and a second electrode layer 15b formed from the same conductive film as a source electrode 7S of the TFT 10. In this example, the patch electrode 15 further includes a third electrode layer 15c.

Since the TFT substrate 101 to be used for the scanning antenna according to the embodiment of the present disclosure has the patch electrode 15 including the first electrode layer 15a formed from the same conductive film as the gate electrode 3G of the TFT 10 and the second electrode layer 15b formed from the same conductive film as the source electrode 7S of the TFT 10, it is possible to reduce the cost of the scanning antenna while suppressing deterioration of the antenna performance, as described below.

As illustrated in FIGS. 3A and 3B, the TFT 10 in each antenna unit region U has the gate electrode 3G, an island-shaped semiconductor layer 5, a source contact layer 6S and a drain contact layer 6D, a gate insulating layer 4 arranged between the gate electrode 3G and the semiconductor layer 5, the source electrode 7S, and the drain electrode 7D.

In this example, the TFT 10 is a channel etch type TFT having a bottom gate structure. The gate electrode 3G is arranged under the semiconductor layer 5 via the gate insulating layer 4. In this example, the source electrode 7S and the drain electrode 7D are formed to be connected to the upper surface of the semiconductor layer 5. That is, the TFT 10 has a top contact structure. Here, the source electrode 7S and the drain electrode 7D are connected to the upper surface of the semiconductor layer 5 via the source contact layer 6S and the drain contact layer 6D, respectively.

The gate electrode 3G is electrically connected to the gate bus line GL, and the scanning signal voltage is supplied from the gate bus line GL. The source electrode 7S is electrically connected to the source bus line SL, and the data signal voltage is supplied from the source bus line SL. In this example, the gate electrode 3G and the gate bus line GL are formed from the same conductive film (gate conductive film). Here, the source electrode 7S, the drain electrode 7D, and the source bus line SL are formed from the same conductive film (source conductive film). The gate conductive film and the source conductive film include, for example, a metal film. A layer including the gate electrode 3G formed using a gate conductive film may be referred to as a "gate metal layer 3", and a layer including the source electrode 7S formed using a source conductive film may be referred to as "source metal layer 7".

The TFT substrate 101 includes a gate metal layer 3 supported on the dielectric substrate 1, the semiconductor layer 5 of the TFT 10 supported on the dielectric substrate 1, the gate insulating layer 4 formed between the semiconductor layer 5 and the gate metal layer 3, and a source metal layer 7 supported on the dielectric substrate 1. The TFT substrate 101 also has an interlayer insulating layer 11 formed on the gate metal layer 3 and the source metal layer 7 and an upper conductive layer 19 formed on the interlayer insulating layer 11. In this example, as described above, the semiconductor layer 5 is formed on the gate insulating layer 4. In addition, in this example, the source metal layer 7 is formed on the gate insulating layer 4 and the semiconductor layer 5.

The gate metal layer 3 includes the gate electrode 3G of the TFT 10, a gate bus line GL, and the first electrode layer 15a of the patch electrode 15.

The gate insulating layer 4 has an opening portion 4p reaching the first electrode layer 15a of the patch electrode 15.

The source metal layer 7 includes the source electrode 7S and the drain electrode 7D of the TFT 10, a source bus line SL, and the second electrode layer 15b of the patch electrode 15. The second electrode layer 15b of the patch electrode 15 is connected to the first electrode layer 15a of the patch electrode 15 in the opening portion 4p formed in the gate insulating layer 4.

The interlayer insulating layer 11 has an opening portion 1ip reaching the second electrode layer 15b of the patch electrode 15.

The upper conductive layer 19 includes the third electrode layer 15c of the patch electrode 15. The third electrode layer 15c of the patch electrode 15 is connected to the second electrode layer 15b of the patch electrode 15 in the opening portion 11p formed in the interlayer insulating layer 11. The third electrode layer 15c of the patch electrode 15 is formed to cover a portion of the second electrode layer 15b of the patch electrode 15 which is exposed in the opening portion 1ip, for example.

As described below with reference to FIG. 4A and FIG. 4B, the third electrode layer 15c of the patch electrode 15 is formed from the same conductive film as the upper connection portion of each terminal portion formed in the non-transmission/reception region R2. That is, the upper conductive layer 19 includes the third electrode layer 15c of the patch electrode 15 and the upper connection portion of each terminal portion formed in the non-transmission/reception region R2. Due to this, the manufacturing cost of the TFT substrate 101 is reduced.

The upper conductive layer 19 includes, for example, a transparent conductive layer (for example, an ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed from, for example, a single layer or a laminate of two or more layers selected from the group consisting of a Ti layer, a MoNbNi layer, a MoNb layer, a MoW layer, a W layer, and a Ta layer.

The patch electrode 15 preferably includes at least one low resistance metal layer from the viewpoint of antenna performance. The performance of the scanning antenna is correlated with the electric resistance of the patch electrode 15, and the thickness of the main layer is set to obtain a desired resistance. Here, the "low resistance metal layer" is a layer including at least one element selected from the group consisting of copper (Cu), aluminum (Al), silver (Ag), and gold (Au). The "low resistance metal layer" may have a laminated structure. The low resistance metal layer of the patch electrode 15 may be referred to as the "main layer". The patch electrode 15 includes, for example, a Cu layer and/or an Al layer as a main layer. From the viewpoint of electric resistance, there is a possibility that the thickness of the patch electrode 15 may be made smaller in the Cu layer than in the Al layer.

The patch electrode 15 may further include a high melting point metal-containing layer. Here, the "high melting point metal-containing layer" is a layer including at least one element selected from the group consisting of titanium (Ti), tungsten (W), molybdenum (Mo), tantalum (Ta), and niobium (Nb). The "high melting point metal-containing layer" may have a laminated structure. For example, the high-melting-point metal-containing layer indicates a layer formed of any one of Ti, W, Mo, Ta, Nb, an alloy containing the above, nitrides thereof, or a solid solution of the nitrides with the metal or the alloy.

Each of the gate metal layer 3 and the source metal layer 7 independently has, for example, a laminated structure having a low resistance metal layer and a high melting point metal-containing layer under the low resistance metal layer. The gate metal layer 3 and/or the source metal layer 7 may further have a high melting point metal-containing layer on the low resistance metal layer. Only one of the gate metal layer 3 and the source metal layer 7 may contain a low resistance metal layer.

For example, the first electrode layer 15a (that is, the gate metal layer 3) and the second electrode layer 15b (that is, the source metal layer 7) of the patch electrode 15 each independently include an Al layer or a Cu layer. Both of the first electrode layer 15a and the second electrode layer 15b of the patch electrode 15 may include a Cu layer or both may include an Al layer. The first electrode layer 15a of the patch electrode 15 has a thickness of, for example, 0.1 μm or more and 1.0 μm or less (100 nm or more and 1000 nm or less). The second electrode layer 15b of the patch electrode 15 has a thickness of, for example, 0.1 μm or more and 1.0 μm or less (100 nm or more and 1000 nm or less).

The thickness of the low resistance metal layer of the patch electrode 15 is, for example, 0.2 μm or more and 2.0 μm or less (200 nm or more and 2000 nm or less). The patch electrode 15 may include a plurality of low resistance metal layers. In a case where the patch electrode 15 includes a plurality of low resistance metal layers, "the thickness of the low resistance metal layer of the patch electrode 15" is the sum of the thicknesses thereof. The patch electrode 15 may have a laminate structure including two low resistance metal layers and a high melting point metal-containing layer between the two low resistance metal layers. The plurality of low resistance metal layers of the patch electrode 15 may be formed from the same metal material or metal materials which are different from each other.

The low resistance metal layer of the patch electrode 15 is preferably covered with an insulating layer and/or a conductive layer not including a low resistance metal. When the low resistance metal layer of the patch electrode 15 is covered with the insulating layer or the conductive layer not including the low resistance metal, it is possible to suppress the occurrence of corrosion in the low resistance metal layer (that is, the main layer) of the patch electrode 15 and/or elution of the low resistance metal into the liquid crystal layer. Due to this, it is possible to suppress deterioration of the antenna performance of the scanning antenna. When a low resistance metal (for example, Cu or Al) elutes into the liquid crystal layer, the antenna performance may be deteriorated for the following reason.

As described above, the scanning antenna controls the voltage applied to each liquid crystal layer of each antenna and changes the effective dielectric constant M (εM) of the liquid crystal layer of each antenna unit to form a two-dimensional pattern in the antenna units with different electrostatic capacitances. Since the specific resistance is low in the liquid crystal material having a large dielectric anisotropy δεM (birefringence δn with respect to visible light) in the microwave region, the holding ratio of the voltage applied to the liquid crystal capacity is low. When the voltage holding ratio of the liquid crystal capacity decreases, the effective voltage to be applied to the liquid crystal layer decreases and the target voltage is not applied to the liquid crystal layer. As a result, the retardation to be imparted to the microwaves by the liquid crystal layer of each antenna is shifted from the prescribed value. If the retardation is shifted from the prescribed value, the antenna performance is deteriorated. In practice, since the scanning antenna is designed to maximize the gain at a predetermined resonance frequency, the decrease in the voltage holding ratio manifests as a decrease in gain, for example.

The liquid crystal material having a large dielectric anisotropy 6M in the microwave region includes, for example, an isothiocyanate group (—NCS) or a thiocyanate group (—SCN). A liquid crystal material including an isothiocyanate group or a thiocyanate group has lower chemical stability than a liquid crystal material currently used for LCD, and is easily deteriorated. When the liquid crystal material deteriorates, the specific resistance further decreases and the voltage holding ratio further decreases. For example, since the isothiocyanate group and thiocyanate group have strong polarity, the isothiocyanate group and thiocyanate group react with metal ions (for example, Cu ions or Al ions). Due to this, since the specific resistance of the liquid crystal material decreases and/or the ionic impurity increases, the voltage holding ratio of the liquid crystal capacity decreases.

In the TFT substrate 101, the patch electrode 15 includes the third electrode layer 15c. The third electrode layer 15c of the patch electrode 15 does not include a low resistance metal. The third electrode layer 15c is formed to cover the second electrode layer 15b exposed in the opening portion lip formed in the interlayer insulating layer 11. Therefore, it is possible to suppress the occurrence of corrosion in the main layer of the patch electrode 15 and/or the elution of the low resistance metal into the liquid crystal layer. Deterioration of the antenna performance of the scanning antenna provided with the TFT substrate 101 is suppressed. In addition, in this example, since the patch electrode 15 is not covered with the insulating layer, it is possible to realize a good antenna performance.

In a case of forming the patch electrode only with the source metal layer, when the thickness of the patch electrode is increased, the following problems may occur. Also, depending on the structure of the TFT, for example, a source metal layer having a thickness exceeding 1 μm may not be able to obtain a desired patterning accuracy. For example, there may be a problem in that it is not possible to control the length of the gap between the source electrode and the drain electrode (corresponding to the channel length of the TFT) with high precision. In addition, as described above, when the thickness of the main layer of the patch electrode is small, it is not possible to obtain a desired electric resistance and the antenna performance may be deteriorated.

In contrast, since the patch electrode 15 of the TFT substrate 101 includes the first electrode layer 15a included in the gate metal layer 3 and the second electrode layer 15b included in the source metal layer 7, the thickness of the patch electrode 15 is greater than the thickness of the source electrode 7S and the drain electrode 7D. Accordingly, it is possible to increase the thickness of the patch electrode 15 without deteriorating the precision of the control of the channel length of the TFT. According to the TFT substrate 101, it is possible to obtain a scanning antenna having excellent antenna performance while controlling the channel length of the TFT with high precision.

Figure 6:
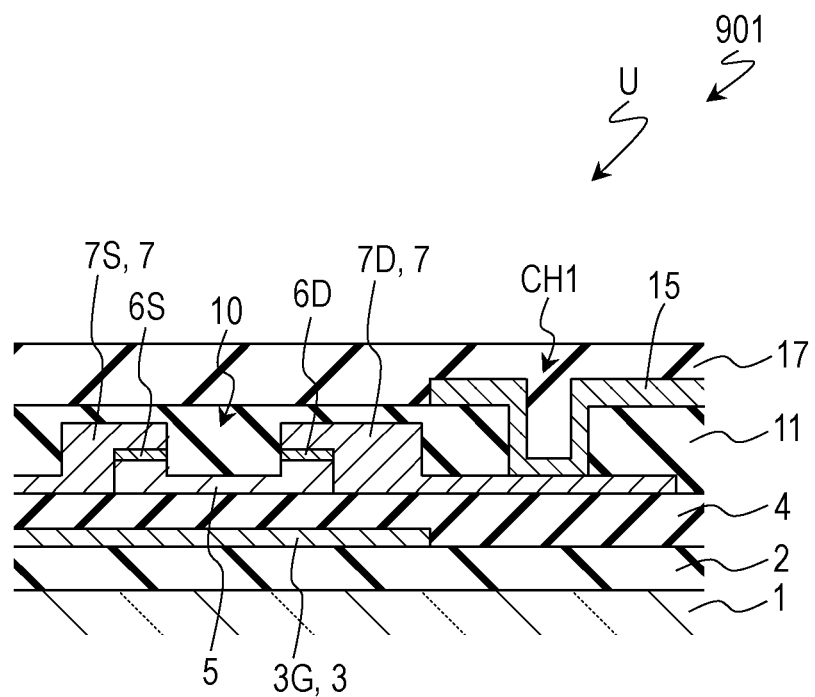
FIG. 6 is a schematic sectional view of a TFT substrate provided in the scanning antenna of International Publication No. 2017/061527.

FIG. 6 is a schematic sectional view of the TFT substrate 901 provided in the scanning antenna of International Publication No. 2017/061527. In FIG. 6, substantially the same components as in the TFT substrate 101 are denoted by the same reference numerals, and description thereof may be omitted.

As illustrated in FIG. 6, the patch electrode 15 of the TFT substrate 901 is included in a conductive layer separate from the gate metal layer 3 and the source metal layer 7. The TFT substrate 901 also has a second insulating layer 17 covering the patch electrode 15. The upper conductive layer 19 of the TFT substrate 901 is formed on the second insulating layer 17. The patch electrode 15 of the TFT substrate 901 is formed on the interlayer insulating layer 11 and in a contact hole CH1 formed in the interlayer insulating layer 11, and is connected to the drain electrode 7D in the contact hole CH1.

In the TFT substrate 901, it is possible to control the thickness of the source metal layer 7 and the thickness of the patch electrode 15 independently. According to the TFT substrate 901, it is possible to obtain a scanning antenna having excellent antenna performance while controlling the channel length of the TFT with high precision.

However, from the viewpoint of manufacturing cost, the TFT substrate 901 is inferior to the TFT substrate 101 to be used for the scanning antenna according to the embodiment of the present disclosure. A patch metal layer including a metal layer is formed in the TFT substrate 901 separately from the gate metal layer 3 and the source metal layer 7 in order to form the patch electrode 15.

On the other hand, in the TFT substrate 101 used for the scanning antenna according to the embodiment of the present disclosure, since no metal layer separate from the gate metal layer 3 and the source metal layer 7 is formed in order to form the patch electrode 15, it is possible to carry out the manufacturing at a lower cost in comparison with the TFT substrate 901. In addition, it is possible to manufacture the TFT substrate 101 with a smaller number of manufacturing steps (for example, the number of photomasks) than in the TFT substrate 901. In this example, the patch electrode 15 of the TFT substrate 101 includes the third electrode layer 15c included in the upper conductive layer 19; however, as described above, since the upper conductive layer 19 is a conductive layer which includes the upper connection portion of each terminal portion, an increase in cost for forming the patch electrode is suppressed.

As illustrated in FIG. 3A and FIG. 3B, each antenna unit region U may have an auxiliary capacitance electrically connected in parallel with the liquid crystal capacity. In this example, the auxiliary capacitance is formed of an upper auxiliary capacitance electrode 7C electrically connected to the drain electrode 7D, the gate insulating layer 4, and a lower auxiliary capacitance electrode 3C facing the upper auxiliary capacitance electrode 7C via the gate insulating layer 4. The upper auxiliary capacitance electrode 7C is included in the source metal layer 7, and the lower auxiliary capacitance electrode 3C is included in the gate metal layer 3. The gate metal layer 3 further includes a CS bus line (auxiliary capacity line) CL connected to the lower auxiliary capacitance electrode 3C. The CS bus line CL extends, for example, substantially in parallel with the gate bus line GL. In this example, the lower auxiliary capacitance electrode 3C is formed integrally with the CS bus line CL. The width of the lower auxiliary capacitance electrode 3C may be larger than the width of the CS bus line CL. In addition, in this example, the upper auxiliary capacitance electrode 7C is extended from the drain electrode 7D. The width of the upper auxiliary capacitance electrode 7C may be greater than the width of a portion other than the upper auxiliary capacitance electrode 7C in a portion extending from the drain electrode 7D. In this example, the patch electrode 15 is extended from the upper auxiliary capacitance electrode 7C extending from the drain electrode 7D. The positional relationship between the auxiliary capacitance and the patch electrode 15 is not limited to the illustrated example.

In this example, the second electrode layer 15b of the patch electrode 15 is extended from the upper auxiliary capacitance electrode 7C and is formed integrally with the upper auxiliary capacitance electrode 7C. The patch electrode 15 is electrically connected to the drain electrode 7D via the upper auxiliary capacitance electrode 7C. However, the method for electrically connecting the drain electrode 7D and the patch electrode 15 is not limited to the illustrated example.

The embodiment of the present disclosure is not limited to the illustrated example. For example, the structure of the TFT is not limited to the illustrated example, and the arrangement relationship (that is, the vertical relationship) between the gate metal layer 3 and the source metal layer 7 may be reversed. The TFT may have a top gate structure. In the example illustrated in FIGS. 3A and 3B, the source metal layer 7 is formed on the gate metal layer 3. That is, the second electrode layer 15b of the patch electrode 15 is formed on the first electrode layer 15a. The present disclosure is not limited thereto, and the gate metal layer may be formed on the source metal layer. That is, the first electrode layer formed from the same conductive film as the gate electrode may be formed on the second electrode layer formed from the same conductive film as the source electrode.

Figure 4A:
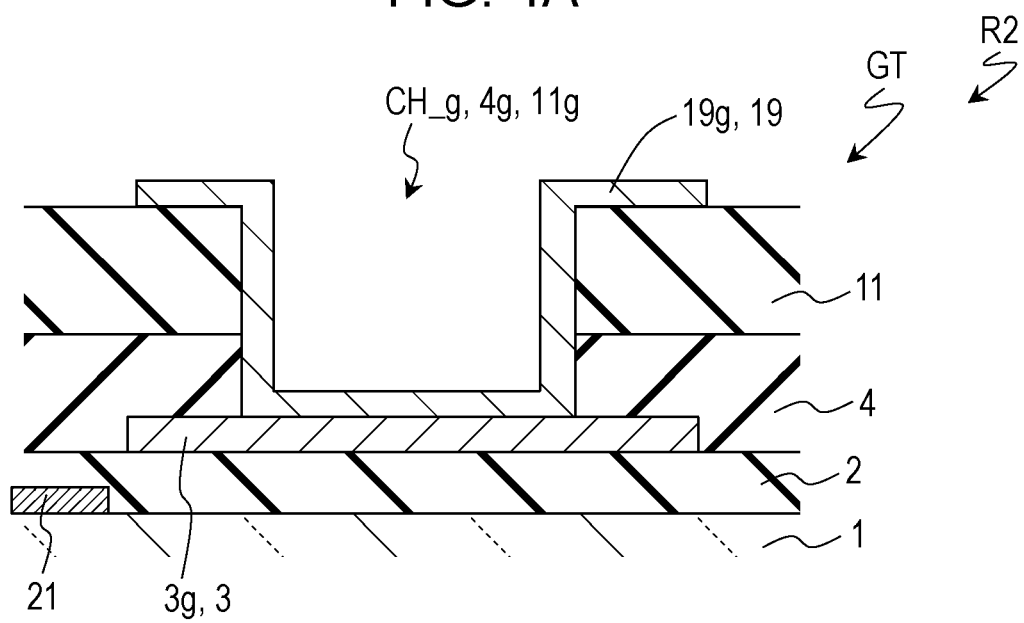
FIG. 4A and FIG. 4B are schematic sectional views of a non-transmission/reception region of the TFT substrate.
Figure 4B:
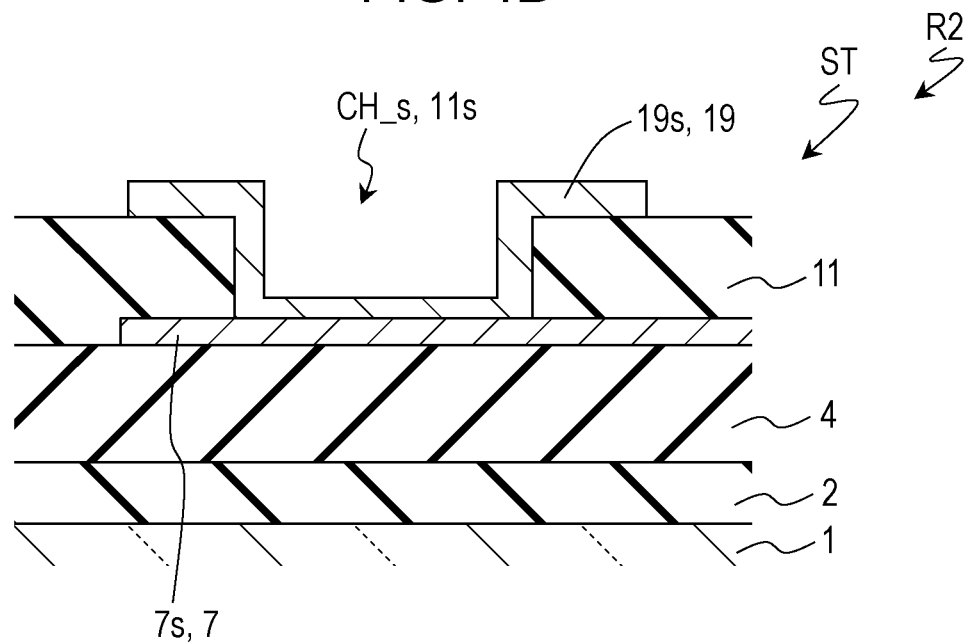

FIGS. 4A and 4B are schematic sectional views of the non-transmission/reception region R2 of the TFT substrate 101. FIGS. 4A and 4B schematically illustrate the gate terminal portion GT and the source terminal portion ST, respectively.

As illustrated in FIG. 4A, the gate terminal portion GT has a gate terminal lower connection portion 3g (may be referred to simply as the "lower connection portion 3g") electrically connected to the gate bus line, a contact hole CH_g formed in the gate insulating layer 4 and the interlayer insulating layer 11, and a gate terminal upper connection portion 19g (may be referred to simply as "upper connection portion 19g").

The lower connection portion 3g is included in the gate metal layer 3 in this example. The lower connection portion 3g may be formed integrally with the gate bus line GL, for example.

The contact hole CH_g formed in the gate insulating layer 4 and the interlayer insulating layer 11 reaches the lower connection portion 3g. The contact hole CH_g includes an opening portion 4s formed in the gate insulating layer 4 and an opening portion 11s formed in the interlayer insulating layer 11.

The upper connection portion 19g is included in the upper conductive layer 19. The upper connection portion 19g is connected to the lower connection portion 3g in the contact hole CH_g formed in the gate insulating layer 4 and the interlayer insulating layer 11.

As illustrated in FIG. 4B, the source terminal portion ST has a source terminal lower connection portion 7s (may be referred to simply as "lower connection portion 7s") electrically connected to the source bus line, a contact hole CH_s (may be referred to as the "opening portion 11s") formed in the interlayer insulating layer 11, and a source terminal upper connection portion 19s (may be referred to simply as the "upper connection portion 19s").

The lower connection portion 7s is included in the source metal layer 7 in this example. The lower connection portion 7s may be formed integrally with the source bus line SL, for example. However, without being limited to the illustrated example, the source terminal lower connection portion may be formed from the gate metal layer 3. In such a case, it is possible for the sectional structure of the source terminal portion to be similar to the sectional structure of the gate terminal portion GT.

The contact hole CH_s formed in the interlayer insulating layer 11 reaches the lower connection portion 7s.

The upper connection portion 19s is included in the upper conductive layer 19. The upper connection portion 19s is connected to the lower connection portion 7s in the contact hole CH_s formed in the interlayer insulating layer 11.

As illustrated in FIG. 4A and FIG. 4B, the TFT substrate 101 may also have an alignment mark (for example, a metal layer) 21 further to the dielectric substrate 1 side than the gate metal layer 3, and a base insulating layer 2 covering the alignment mark 21. For example, regarding the alignment mark 21, when the number of photomasks is n (n<m) in a case of manufacturing m TFT substrates from one glass substrate, it is necessary to perform each exposure step a plurality of times. When the number (n) of photomasks is smaller than the number (m) of TFT substrates manufactured from one glass substrate in this manner, it is possible to use the alignment mark 21 for the alignment of the photomask. It is possible to omit the alignment mark 21 and the base insulating layer 2. In FIG. 3A, illustration of the alignment mark 21 and the base insulating layer 2 is omitted.

The shape and position of the alignment mark are not limited to the illustrated example. For example, the alignment mark may be formed of the gate metal layer 3. In such a case, it is possible to reduce the manufacturing cost (for example, the number of photomasks) in comparison with a case of forming the alignment mark from a metal layer on the dielectric substrate 1 side rather than the gate metal layer 3 (refer to, for example, FIG. 4A). In such a case, it is possible to omit the base insulating layer 2.

Method of Manufacturing TFT Substrate 101

A description will be given of a method of manufacturing the TFT substrate 101.

First, a metal film (for example, a Ti film, a Mo film, a Ta film, an Al film, or a Cu film) is formed on the dielectric substrate 1 and patterned to form the alignment mark 21. As the dielectric substrate 1, it is possible to use, for example, a glass substrate, a plastic substrate (resin substrate) having heat resistance, or the like. Next, the base insulating layer 2 is formed to cover the alignment mark 21. Here, for example, silicon oxide (SiOx) or silicon nitride (SixNy) film is formed as the base insulating layer 2. In a case of forming the alignment mark from the gate metal layer 3, forming the alignment mark 21 and the base insulating layer 2 is omitted. In such a case, an alignment mark may be formed in the patterning of the gate conductive film described below.

Subsequently, a gate conductive film is formed on the dielectric substrate 1 by a sputtering method or the like. Here, as a gate conductive film, a laminated film (MoN/Al) is formed by laminating an Al film (thickness: 150 nm, for example) and a MoN film (thickness: 100 nm for example) in this order. Alternatively, as the gate conductive film, a laminated film (Cu/Ti) in which a Ti film (thickness: 20 nm, for example) and a Cu film (thickness: 200 nm for example) are laminated in this order may be formed.

Next, the gate conductive film is patterned to form the gate metal layer 3. The gate metal layer 3 includes the gate electrode 3G of the TFT 10, the gate bus line GL, and the first electrode layer 15a of the patch electrode 15. The patterning of the gate conductive film is performed by, for example, wet etching (wet etching) and/or dry etching (dry etching).

Thereafter, a gate insulating film, an intrinsic amorphous silicon film, and an n+ type amorphous silicon film are formed in this order to cover the gate metal layer 3. It is possible to form the gate insulating film by a CVD method or the like. As the gate insulating film, it is possible to appropriately use a silicon oxide (SiOx) film, a silicon nitride (SixNy) film, a silicon oxynitride (SiOxNy; x>y) film, a silicon nitride oxide (SiNxOy; x>y) film, or the like. Here, as a gate insulating film, for example, a silicon nitride (SixNy) film having a thickness of 350 nm is deposited. For example, an intrinsic amorphous silicon film with a thickness of 120 nm and an n+ type amorphous silicon film with a thickness of, for example, 30 nm are formed on the gate insulating film.

Next, the intrinsic amorphous silicon film and the n+ type amorphous silicon film are patterned to obtain the island-shaped semiconductor layer 5 and a contact layer. Here, the semiconductor film to be used for the semiconductor layer 5 is not limited to the amorphous silicon film. For example, an oxide semiconductor layer may be formed as the semiconductor layer 5. In such a case, it is not necessary to provide a contact layer between the semiconductor layer 5 and the source electrode and the drain electrode.

Subsequently, the opening portion 4p reaching the first electrode layer 15a of the patch electrode 15 is formed by etching the gate insulating film using a known photolithography process.

Next, a source conductive film is formed on the gate insulating film, in the opening portion 4p, and on the contact layer by a sputtering method or the like. Here, a laminated film (MoN/Al/MoN) in which MoN (thickness: 50 nm, for example), Al (thickness: 150 nm, for example), and MoN (thickness: 100 nm, for example) are laminated in this order is formed. Alternatively, a layered film (Cu/Ti) in which Ti (thickness: 20 nm, for example) and Cu (thickness: 200 nm, for example) are laminated in this order may be formed as a source conductive film.

Next, the source conductive film is patterned to form the source metal layer 7. At this time, the contact layer is also etched, and the source contact layer 6S and the drain contact layer 6D, which are separated from each other, are formed. The source metal layer 7 includes the source electrode 7S and the drain electrode 7D of the TFT 10, the source bus line SL, and the second electrode layer 15b of the patch electrode 15. The second electrode layer 15b of the patch electrode 15 is connected to the first electrode layer 15a of the patch electrode 15 in the opening portion 4p.

The patterning of the source conductive film is performed by, for example, wet etching (wet etching) and/or dry etching (dry etching). For example, in a case where a laminated film in which a MoN film, an Al film, and a MoN film are laminated in this order is formed as a source conductive film, for example, the MoN film and the Al film are simultaneously patterned by wet etching. In a case of forming a laminated film in which a Ti film and a Cu film are laminated in this order as the source conductive film, it is possible to pattern the Ti film and the Cu film by, for example, wet etching. Thereafter, a portion of the contact layer positioned on the region to be the channel region of the semiconductor layer 5 is removed to form a gap portion by, for example, dry etching, and the source contact layer 6S and the drain contact layer 6D are separated. At this time, in the gap portion, the vicinity of the surface of the semiconductor layer 5 is also etched (over-etching). In this manner, the TFT 10 is obtained.

Next, an interlayer insulating film is formed by, for example, a CVD method, to cover the TFT 10 and the source metal layer 7. As the interlayer insulating film, it is possible to appropriately use a silicon oxide (SiOx) film, a silicon nitride (SixNy) film, a silicon oxynitride (SiOxNy; x>y) film, a silicon nitride oxide (SiNxOy; x>y) film, or the like. In this example, the interlayer insulating film is formed to be in contact with the channel region of the semiconductor layer 5. Here, as an interlayer insulating film, for example, a silicon nitride (SixNy) film having a thickness of 330 nm is deposited.

Subsequently, the interlayer insulating film and the gate insulating film are etched by a known photolithography process to form the interlayer insulating layer 11 and the gate insulating layer 4. Specifically, the opening portion 11p reaching the second electrode layer 15b of the patch electrode 15 is formed in the interlayer insulating film. In addition, the contact hole CH_g reaching the lower connection portion 3g of the gate terminal portion is formed in the interlayer insulating film and the gate insulating film, and the contact hole CH_s (opening portion 11s) reaching the lower connection portion 7s of the source terminal portion is formed in the interlayer insulating film.

Next, an upper conductive film including a transparent conductive film is formed on the interlayer insulating layer 11 and in the opening portion 11p, the contact hole CH_g, and the contact hole CH_s by a sputtering method, for example. As the transparent conductive film, for example, it is possible to use an ITO (indium tin oxide) film, an IZO film, a ZnO film (zinc oxide film), or the like. Here, a laminated film (ITO/Ti) in which Ti (thickness: 50 nm, for example) and ITO (thickness: 70 nm, for example) are laminated in this order is used as the upper conductive film.

Next, the upper conductive film is patterned to form the upper conductive layer 19. The upper conductive layer 19 includes the third electrode layer 15c of the patch electrode 15. The third electrode layer 15c of the patch electrode 15 is connected to the second electrode layer 15b of the patch electrode 15 in the opening portion 11p formed in the interlayer insulating layer 11. The upper conductive layer 19 further includes upper connection portions 19g and 19s of each terminal portion.

In this manner, the TFT substrate 101 is manufactured.

Modification Example

Figure 5A:
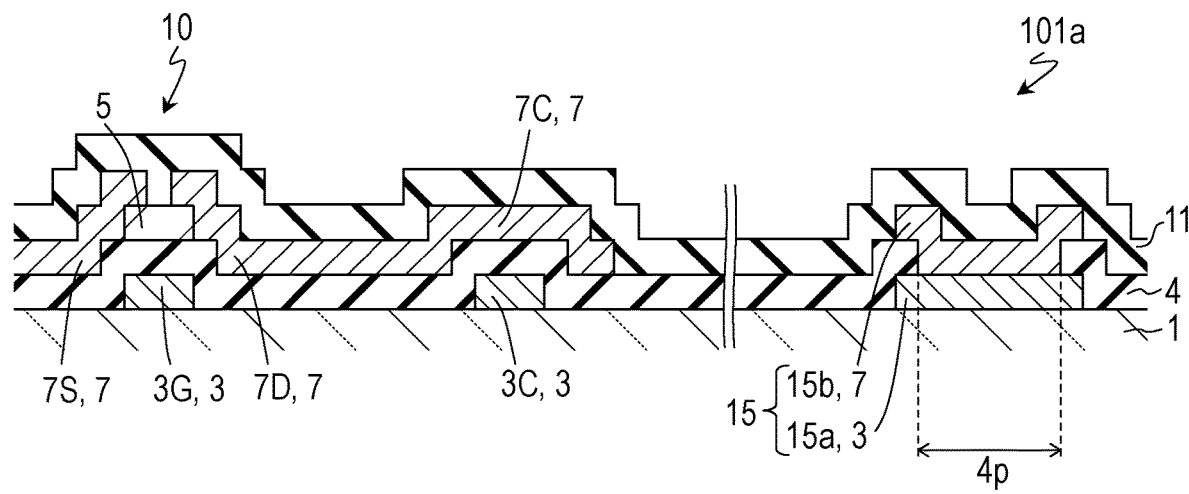
FIG. 5A is a schematic sectional view of a TFT substrate of a modification example.
Figure 5B:
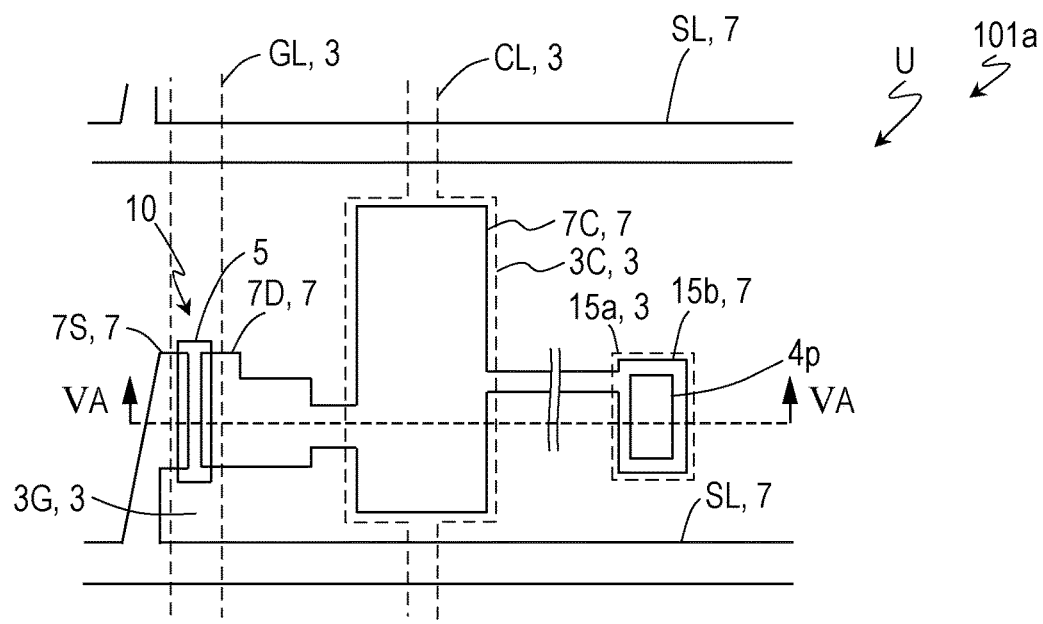
FIG. 5B is a schematic plan view of the TFT substrate.

With reference to FIG. 5A and FIG. 5B, a description will be given of the TFT substrate 101a of a modification example. FIG. 5A is a schematic sectional view of the TFT substrate 101a and illustrates a section along line VA-VA of FIG. 5B. FIG. 5B is a schematic plan view of the antenna unit region U of the TFT substrate 101a. In FIG. 5A and FIG. 5B, common components to those of the TFT substrate 101 illustrated in FIGS. 3A and 3B are denoted by the same reference numerals, and the description thereof may be omitted.

As illustrated in FIG. 5A and FIG. 5B, the patch electrode 15 of the TFT substrate 101a is different from the TFT substrate 101 in terms of being covered with the interlayer insulating layer 11. That is, in the TFT substrate 101a, the opening portion 11p formed in the interlayer insulating layer 11 and the third electrode layer 15c of the patch electrode 15 are omitted.

Even in the TFT substrate 101a having such a structure, it is possible to obtain the same effect as the TFT substrate 101.

Furthermore, in the TFT substrate 101a, since the main layer of the patch electrode 15 is covered with the interlayer insulating layer 11, it is possible to effectively suppress the occurrence of corrosion in the main layer of the patch electrode 15 and/or the elution of the low resistance metal into the liquid crystal layer. In order to obtain high antenna performance, the thickness of the interlayer insulating layer 11 is preferably small.

It is possible to manufacture the TFT substrate 101a by omitting the opening portion 11p and the third electrode layer 15c of the patch electrode 15 from the manufacturing method of the TFT substrate 101.

Material and Structure of TFT

In the embodiment of the present disclosure, a TFT with the semiconductor layer 5 as an active layer is used as a switching element arranged in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, a crystalline oxide semiconductor in which the c-axis is oriented substantially perpendicularly to the layer surface, and the like.

The oxide semiconductor layer may have a laminated structure with two or more layers. In a case where the oxide semiconductor layer has a laminated layer structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has a two-layer structure including an upper layer and a lower layer, the energy gap of the oxide semiconductor included in the upper layer is preferably larger than the energy gap of the oxide semiconductor included in the lower layer. However, in a case where the difference in energy gap between these layers is relatively small, the energy gap of the lower layer oxide semiconductor may be larger than the energy gap of the upper layer oxide semiconductor.

The material, structure, and film forming method of the amorphous oxide semiconductor and each of the above-described crystalline oxide semiconductors, the configuration of an oxide semiconductor layer having a laminated structure, and the like are described in, for example, Japanese Unexamined Patent Application Publication No. 2014-007399. All the disclosed content of Japanese Unexamined Patent Application Publication No. 2014-007399 is incorporated in the present specification by reference.

The oxide semiconductor layer may include, for example, at least one kind of metal element selected from In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio (composition ratio) of In, Ga, and Zn is not particularly limited and includes, for example, In:Ga:Zn=2:2:1, In:Ga:Zn=1:1:1, In:Ga:Zn=1:1:2, and the like. It is possible to form such an oxide semiconductor layer from an oxide semiconductor film including an In—Ga—Zn—O-based semiconductor.

The In—Ga—Zn—O-based semiconductor may be amorphous or may be crystalline. As a crystalline In—Ga—Zn—O-based semiconductor, a crystalline In—Ga—Zn—O-based semiconductor in which the c-axis is oriented substantially perpendicular to the layer surface is preferable.

The crystal structure of a crystalline In—Ga—Zn—O-based semiconductor is disclosed in, for example, Japanese Unexamined Patent Application Publication No. 2014-007399, Japanese Unexamined Patent Application Publication No. 2012-134475, Japanese Unexamined Patent Application Publication No. 2014-209727, and the like. All of the disclosed contents of Japanese Unexamined Patent Application Publication No. 2012-134475 and Japanese Unexamined Patent Application Publication No. 2014-209727 are incorporated in the present specification by reference. Since a TFT having an In—Ga—Zn—O-based semiconductor layer has high mobility (more than 20 times compared with an a-Si TFT) and low leak current (less than 1/100th compared with an a-Si TFT), such a TFT is preferably used as a driving TFT (for example, a TFT included in a driving circuit to be provided in a non-transmission/reception region), and as a TFT to be provided in each antenna unit region.

Instead of the In—Ga—Zn—O-based semiconductor, the oxide semiconductor layer may include another oxide semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

In the example illustrated in FIGS. 3A and 3B and FIG. 5A and FIG. 5B, the TFT 10 is a channel etch type TFT having a bottom gate structure. In the "channel etch type TFT", no etch stop layer is formed on the channel region, and the lower surface of the end portion on the channel side of the source and drain electrodes is arranged to be in contact with the upper surface of the semiconductor layer. The channel etch type TFT is formed by, for example, forming a conductive film for a source/drain electrode on a semiconductor layer and performing source/drain separation. The surface portion of the channel region may be etched in the source/drain separation step.

Here, the TFT 10 may be an etch stop type TFT in which an etch stop layer is formed on a channel region. In the etch stop type TFT, the lower surface of the end portion on the channel side of the source and drain electrodes is positioned, for example, on the etch stop layer. An etch stop type TFT is formed by, for example, forming an etch stop layer covering a portion to be a channel region in a semiconductor layer, then forming a conductive film for a source/drain electrode on a semiconductor layer and an etch stop layer, and performing source/drain separation. However, in the TFT substrate having the etch stop type TFT, the number of photomasks necessary for manufacturing increases by the number of the photomasks for forming the etch stop layer.

In addition, the TFT 10 has a top contact structure in which the source and drain electrodes are in contact with the upper surface of the semiconductor layer, but the source and drain electrodes may be arranged to be in contact with the lower surface of the semiconductor layer (bottom contact structure). Furthermore, the TFT 10 may have a bottom gate structure having a gate electrode on the dielectric substrate side of the semiconductor layer, or a top gate structure having a gate electrode above the semiconductor layer.

Examples of Antenna Unit Arrangement and Gate Bus Line and Source Bus Line Connection In the scanning antenna according to the embodiment of the present disclosure, the antenna units are arranged, for example, in concentric circles.

For example, in a case of being arranged in m concentric circles, one gate bus line is provided for each circle, for example, and a total of m gate bus lines are provided. For example, when the outer diameter of the transmission/reception region R1 is set to 800 mm, m is 200, for example. When the innermost gate bus line is the first line, n (for example, 30) antenna units are connected to the first gate bus line and nx (for example, 620) antenna units are connected to the m-th gate bus line.

In such an arrangement, the number of antenna units connected to each gate bus line is different. In addition, among the nx source bus lines connected to the nx antenna units forming the outermost circle, m antenna units are connected to the n source bus lines also connected to the antenna unit forming the innermost circle, but the number of antenna units connected to the other source bus lines is smaller than m.

As described above, the arrangement of antenna units in the scanning antenna is different from the arrangement of pixels (dots) in the LCD panel, and the number of connected antenna units is different according to the gate bus lines and/or the source bus lines. Accordingly, when the capacitances (liquid crystal capacitances+auxiliary capacitances) of all the antenna units are set to be the same, the connected electrical loads are different depending on the gate bus lines and/or the source bus lines. In this manner, there is a problem that variations occur in the writing of the voltage to the antenna units.

Therefore, in order to prevent the above, for example, the electrical loads connected to each gate bus line and each source bus line are preferably made substantially equal by adjusting the capacitance value of the auxiliary capacitance or by adjusting the number of antenna units connected to the gate bus lines and/or the source bus lines.

The scanning antenna according to the embodiment of the present disclosure is accommodated in a housing made of plastic, for example, as necessary. It is preferable to use a housing material having a small dielectric constant εM which does not influence microwave transmission/reception. In addition, a through hole may be provided in a portion corresponding to the transmission/reception region R1 of the housing. Furthermore, a light shielding structure may be provided so that the liquid crystal material is not exposed to light. The light shielding structure, for example, is provided to block light which propagates from the side surface of the dielectric substrate 1 of the TFT substrate 101 and/or the dielectric substrate 51 of the slot substrate 201 to the inside of the dielectric substrate 1 and/or the dielectric substrate 51 to be incident on the liquid crystal layer. Some liquid crystal materials having a large dielectric anisotropy δεM are easily affected by photodegradation, and it is preferable to block not only ultraviolet rays but also short-wavelength blue light in visible light. For example, using a light-shielding tape such as a black adhesive tape, for example, makes it possible to easily form the light shielding structure in a necessary portion.

Embodiments according to the present disclosure are used for, for example, a scanning antenna for satellite communication or satellite broadcasting to be mounted on a moving body (for example, a ship, an airplane, or an automobile) and the manufacturing thereof.

The present disclosure contains subject matter related to that disclosed in Japanese Priority Patent Application JP 2017-220676 filed in the Japan Patent Office on Nov. 16, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A TFT substrate comprising:
a dielectric substrate;
a plurality of antenna unit regions arranged on the dielectric substrate and each having a TFT and a patch electrode electrically connected to a drain electrode of the TFT,
wherein the patch electrode includes a first electrode layer formed of a conductive film identical to a conductive film of a gate electrode of the TFT and a second electrode layer formed of a conductive film identical to a conductive film of a source electrode of the TFT,
the TFT substrate further comprising:
a gate metal layer supported on the dielectric substrate and including the gate electrode and the first electrode layer;
a semiconductor layer of the TFT supported on the dielectric substrate;
a gate insulating layer formed between the semiconductor layer and the gate metal layer;
a source metal layer supported on the dielectric substrate and including the source electrode, the drain electrode, and the second electrode layer,
an interlayer insulating layer formed on the gate metal layer and the source metal layer; and
an upper conductive layer formed on the interlayer insulating layer,
wherein the interlayer insulating layer has an opening portion reaching the first electrode layer or the second electrode layer,
the patch electrode further includes a third electrode layer connected to the first electrode layer or the second electrode layer in the opening portion,
the third electrode layer is included in the upper conductive layer, and
the third electrode layer is formed to cover a portion of the first electrode layer or the second electrode layer which is exposed in the opening portion.

2. The TFT substrate according to claim 1,
wherein the first electrode layer includes a Cu layer or an Al layer.

3. The TFT substrate according to claim 1,
wherein the second electrode layer includes a Cu layer or an Al layer.

4. The TFT substrate according to claim 1,
wherein the first electrode layer has a thickness of 100 nm or more and 1000 nm or less.

5. The TFT substrate according to claim 1,
wherein the second electrode layer has a thickness of 100 nm or more and 1000 nm or less.

6. The TFT substrate according to claim 1,
wherein the second electrode layer is formed on the first electrode layer.

7. A scanning antenna comprising:
the TFT substrate according to claim 1;
a slot substrate arranged to face the TFT substrate;
a liquid crystal layer provided between the TFT substrate and the slot substrate; and
a reflective conductive plate arranged to face a surface of the slot substrate on an opposite side to the liquid crystal layer via a dielectric layer,
wherein the slot substrate has another dielectric substrate, and a slot electrode formed on a surface of the other dielectric substrate on a side of the liquid crystal layer,
the slot electrode has a plurality of slots, and each of the plurality of slots is arranged to correspond to the patch electrode in each of the plurality of antenna unit regions of the TFT substrate.

8. A method of manufacturing the TFT substrate according to claim 1, the method comprising:
(A) forming a gate conductive film on the dielectric substrate;
(B) forming the gate electrode and the first electrode layer by patterning the gate conductive film;

(C) depositing a gate insulating film which covers the gate electrode and the first electrode layer;
(D) forming a first opening portion reaching the first electrode layer in the gate insulating film;
(E) forming a source conductive film on the gate insulating film and in the first opening portion; and
(F) forming the source electrode and the second electrode layer by patterning the source conductive film.

9. The method of manufacturing a TFT substrate according to claim 8, further comprising:
(G) depositing an interlayer insulating film which covers the source electrode and the second electrode layer;
(H) etching the interlayer insulating film;
(I) forming an upper conductive film on the interlayer insulating film after (H); and
(J) patterning the upper conductive film.

10. The method of manufacturing a TFT substrate according to claim 9,
wherein (H) includes forming the opening portion reaching the second electrode layer, and (J) includes forming the third electrode layer connected to the second electrode layer in the opening portion.

11. A method of manufacturing a TFT substrate,
the TFT substrate comprising:
a dielectric substrate;
a plurality of antenna unit regions arranged on the dielectric substrate and each having a TFT and a patch electrode electrically connected to a drain electrode of the TFT,
wherein the patch electrode includes a first electrode layer formed of a conductive film identical to a conductive film of a gate electrode of the TFT and a second electrode layer formed of a conductive film identical to a conductive film of a source electrode of the TFT, and
the method comprising:
(A) forming a gate conductive film on the dielectric substrate;
(B) forming the gate electrode and the first electrode layer by patterning the gate conductive film;
(C) depositing a gate insulating film which covers the gate electrode and the first electrode layer;
(D) forming a first opening portion reaching the first electrode layer in the gate insulating film;
(E) forming a source conductive film on the gate insulating film and in the first opening portion; and
(F) forming the source electrode and the second electrode layer by patterning the source conductive film.

12. The method of manufacturing a TFT substrate according to claim 11, further comprising:
(G) depositing an interlayer insulating film which covers the source electrode and the second electrode layer;
(H) etching the interlayer insulating film;
(I) forming an upper conductive film on the interlayer insulating film after (H); and
(J) patterning the upper conductive film.

13. The method of manufacturing a TFT substrate according to claim 12,
wherein (H) includes forming a second opening portion reaching the second electrode layer, and (J) includes forming a third electrode layer connected to the second electrode layer in the second opening portion.

* * * * *